US005757939A

United States Patent [19]

Begeja et al.

[11] Patent Number: 5,757,939

[45] Date of Patent: May 26, 1998

[54] METHOD FOR DEMONSTRATING SOUND QUALITY DIFFERENCES BETWEEN AUDIO SAMPLES

[75] Inventors: Lee Begeja, Gillette; Mitchell S. Mayer, Ocean Township, Monmouth County; Robert B. Pladek, Middletown, all of N.J.

[73] Assignee: Lucent Technologies Inc., Murray Hill, N.J.

[21] Appl. No.: 784,965

[22] Filed: Jan. 16, 1997

Related U.S. Application Data

[63] Continuation of Ser. No. 362,388, Dec. 22, 1994, abandoned.

[51] Int. Cl.[6] .............................. H03G 5/00; H04R 29/00

[52] U.S. Cl. .............................. 381/98; 381/56

[58] Field of Search .............................. 381/17, 98, 102–103, 381/106–109, 56, 58

[56] References Cited

U.S. PATENT DOCUMENTS

| | | | |
|---|---|---|---|
| 4,511,917 | 4/1985 | Kohler et al. | 381/56 |
| 4,955,070 | 9/1990 | Welsh et al. | 381/58 |
| 5,228,093 | 7/1993 | Agnello | 381/98 |
| 5,384,856 | 1/1995 | Kyouno et al. | 381/103 |

FOREIGN PATENT DOCUMENTS

| | | | |
|---|---|---|---|
| 2-250500 | 10/1990 | Japan | 381/56 |
| 3-44299 | 2/1991 | Japan | 381/56 |

*Primary Examiner*—Paul Loomis
*Assistant Examiner*—Xu Mei

[57] ABSTRACT

Methods and apparatus are disclosed for demonstrating sound quality differences between two sound samples by negatively filtering a first of two signal samples and subsequently representing the negatively filtered signal sample as a first level of sound quality. The second signal sample is represented as a second level of sound quality, typically of higher quality than the first sound sample. The negative filtering is inverse to the enhancement to be demonstrated. In an exemplary embodiment of the invention, negative filtering techniques are used to demonstrate the differences between an "ordinary" voice sample and an "enhanced" voice sample to be broadcast over television or radio facilities. Negative filtering is limited to a selected frequency or range of frequencies such that there is a demonstrable difference in sound quality between the ordinary voice sample and the enhanced voice sample.

18 Claims, 3 Drawing Sheets

METHOD FOR DEMONSTRATING SOUND QUALITY DIFFERENCES BETWEEN AUDIO SAMPLES

This is a Continuation of application Ser. No. 08/362,388 filed Dec. 22, 1994, now abandoned.

TECHNICAL FIELD

The invention relates to a method of processing audio signals, and more particularly relates to a method of enhancing these signals in such a way that a significant post-broadcast difference in audio quality can be perceived.

BACKGROUND OF THE INVENTION

The broadcast industry operates within strict parameters established by the Federal Communications Commission (FCC). Broadcast bandwidth and maximum power are carefully prescribed and enforced. Broadcast transmitting stations, such as television and radio broadcast stations, have equipment designed to compress and limit the overall dynamic range (i.e., the range of minimum through maximum power that will be allowed) of broadcast sound. The operation of "limiting" ensures that the total power of a broadcast complies with FCC regulations. Compression is a choice made by broadcasters to solve a problem created by the limiting operation.

Greater dynamic range improves the accuracy of sound representation. For example, a large dynamic range will enable a normal conversation to sound very different (e.g., much quieter) than a bomb explosion. However, because the peak power level cannot exceed the FCC specified limit, a large dynamic range limits the overall loudness of a broadcast. Television and radio station managers want the audio levels to be consistently loud at all times so that they can achieve the highest average power possible. Various types of equipment are used to ensure a constant audio level.

Balancing the FCC maximum broadcast power restrictions, the desirability of dynamic range, and the broadcast station's use of compression techniques to maintain constant audio levels makes it difficult to demonstrate differences in sound quality between two sound samples. The sound quality differences result, at least in part, from an increase in dynamic range. Broadcast equipment automatically compresses the dynamic range pre-broadcast to maximize total power, thereby minimizing the differences between two sound samples, and making it difficult to demonstrate differences between an "enhanced" sound sample and a "normal" sound sample.

SUMMARY OF THE INVENTION

The problem of demonstrating sound quality differences between two sound samples is resolved in accordance with the invention by negatively filtering a first of two audio signal samples and subsequently representing the negatively filtered signal sample as a first level of sound quality. The second signal sample is represented as a second level of sound quality, typically of higher quality than the first signal sample. Negative filtering is limited to a selected frequency or range of frequencies such that when broadcast, there is a demonstrable difference in sound quality between the first and second signal samples.

In an exemplary embodiment of the invention, negative filtering techniques are used to demonstrate the differences between an "ordinary" voice sample and an "enhanced" voice sample to be broadcast over television or radio facilities. First, a full bandwidth voice sample is recorded. Selected frequencies, such as the lower range frequencies, of the full bandwidth sample are negatively filtered to produce another recording. The negative filtering is inverse to the enhancement to be demonstrated. The negatively filtered sample is used to represent the ordinary voice sample, while the full bandwidth (i.e., unattenuated) sample is used to represent the enhanced voice sample. The negatively filtered sample and the full bandwidth sample are edited such that the two samples are broadcast sequentially. The full bandwidth sample will sound to a listener as a dramatic improvement over the negatively filtered sample.

DETAILED DESCRIPTION

Figure 1:
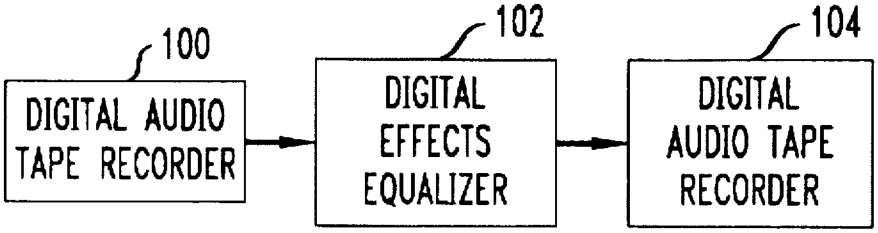
FIG. 1 is a simplified block diagram of illustrative equipment useful for recording and signal processing signal samples in accordance with the principles of the invention.

Before describing the novel features of the present invention, it will be useful to describe briefly various types of equipment and pre-broadcast processing techniques commonly used in television and radio broadcasting. As discussed above, the goal of a broadcast station is to balance dynamic range and the average output power, while operating within the maximum broadcast power limits prescribed by the FCC. To ensure that the FCC power limit is not exceeded, broadcast stations use equipment called "limiters" to prevent signals from becoming greater than a preselected threshold value. Limiters have high gain reduction values, with compression ratios of 20:1 or 100:1 being common. Thus, signals which would exceed the FCC-established power limit are essentially "clipped" at the limit. Broadcast stations minimize clipping by using "compressors" to control the gain of an amplified signal. A compressor is a device which reduces the dynamic range of an input signal. For example, if a compressor is set with a compression ratio of 8:1, an increase of 8 dB in the input signal will produce a 1 dB increase in the output once the threshold is exceeded.

The operation of the compressors make it difficult to demonstrate sound quality differences which exist prior to broadcasting between two audio samples. Take, for example, two audio samples which represent an "ordinary" sound quality and an "enhanced" sound quality, respectively. Prior to broadcasting, the two audio samples may have significantly different sound quality. However, because of the gain compression imposed by the broadcast station's compressors on both audio samples, the "enhanced" audio sample will be compressed prior to broadcast to have similar sound quality as that of the "ordinary" audio sample. The post-broadcast sound quality of the two samples will appear to be very similar, and any enhancement in the sound quality will be lost.

We have discovered that because broadcast equipment will operate automatically to compress the dynamic range of signals prior to broadcast so as to increase the average total output power, one cannot demonstrate differences in sound quality by simply increasing the volume of the sound to be broadcast. In a novel departure from the prior art, improved sound quality is demonstrated accordance with the invention by negatively filtering a first audio sample relative to a second audio sample. The first audio sample is negatively filtered only over a selected range of frequencies or selected ranges of frequencies, such that the difference in sound quality between the first and second audio samples can be demonstrated. The negative filtering applied to the sound sample is at the same frequencies as, and is the inverse in magnitude of, the sound quality differences sought to be demonstrated between the two audio samples. By using (e.g., broadcasting) a negatively filtered sample to represent "ordinary" sound quality and the full bandwidth sample to represent the "enhanced" sound quality, the enhancement can be demonstrated without interference from the broadcast station equipment.

Although the principles of the invention are described in the context of communication media which compress the gain of signals prior to transmission, such as television and radio broadcasting, one skilled in the art will readily appreciate that the invention also is useful in other forms of communication. For example, the principles of the invention can be used to demonstrate differences in sound quality between two (or more) audio samples in movie soundtracks, audio samples recorded on compact disc ("CD") and played over a closed circuit system, and audio samples played on a kiosk system. When audio samples are to be broadcast, it may be desirable to stabilize the level of the audio signals. This can be done by summing the audio signals with a stabilization signal having a predetermined frequency to form a composite audio signal. The stabilization signal has a level that prevents any increase in signal level that may be artificially imposed on the composite signal by the broadcast equipment. Methods and apparatus for using such a composite signal are disclosed in commonly-owned, copending U.S. patent application Ser. No. 08/311,648, filed Sep. 23, 1994, which is hereby incorporated by reference.

Referring now to the drawings, FIG. 1 shows equipment suitable for negatively filtering and recording audio samples in accordance with the invention. The equipment includes digital audio tape recorders 100 and 104, and a digital effects equalizer 102. Digital audio tape recorder 100 records an audio sample, such as a voice sample from a singer, in a conventional manner. This audio sample is referred to as a "full bandwidth" sample because it is recorded in the full bandwidth available in the medium of choice. For example, the bandwidth is 15 kHz for television and radio broadcasts and 20 kHz for CD recordings. As referred to herein, "full bandwidth" also indicates that an audio sample has not been negatively filtered (at least not at certain pre-selected frequencies). Digital effects equalizer 102 negatively filters selected frequencies of the recording and outputs a signal for recording to digital audio tape recorder 104. Digital audio tape recorders 100 and 104 are conventional devices, well known to those skilled in the art. Of course, recording could be performed using standard, multitrack analog tape, such as 16 track or 24 track devices, as an alternative to digital audio tape. Digital effects equalizer 102 may be, for example, a Yamaha DEQ7 digital effects equalizer. An exemplary equalizer (either digital or analog) is a ⅓ octave graphic equalizer having low pass, high pass, and bandpass filtering capabilities.

Figure 2:
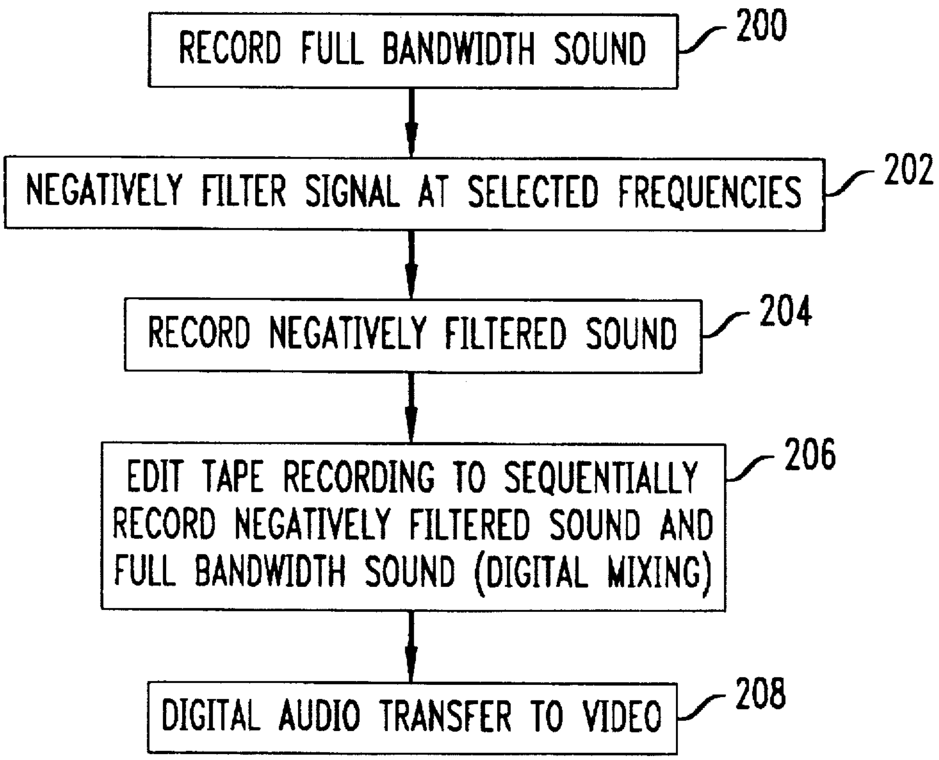
FIG. 2 is a flowchart of a process for preparing a recording in accordance with the invention.

In an exemplary embodiment of the invention, the techniques of the invention are used to demonstrate in a broadcast commercial relative sound quality that can be obtained over given communications facilities before and after modifications to those facilities. Assume, for the purposes of this illustration, that the modifications to the communications facilities introduce gain to selected frequencies of signals transmitted across the communications facilities. Further assume that the gain introduced is 8.5 dB centered around 225 Hz. FIG. 2 shows the overall process for producing a broadcast commercial.

The first step in making a broadcast commercial which demonstrates differences in sound quality resulting from the modifications to the facilities is to record a voice sample that will be used as the basis for subsequent comparisons between sound quality (step 200). This recorded voice sample is a full bandwidth audio sample. One copy of the full bandwidth recording is maintained without further processing. A second copy of the recording is negatively filtered at selected frequencies using digital effects equalizer 102 (step 202) to produce a different audio sample. The negatively filtered sample is recorded on a second digital audio tape (step 204) at digital audio tape recorder 104.

Figure 3:
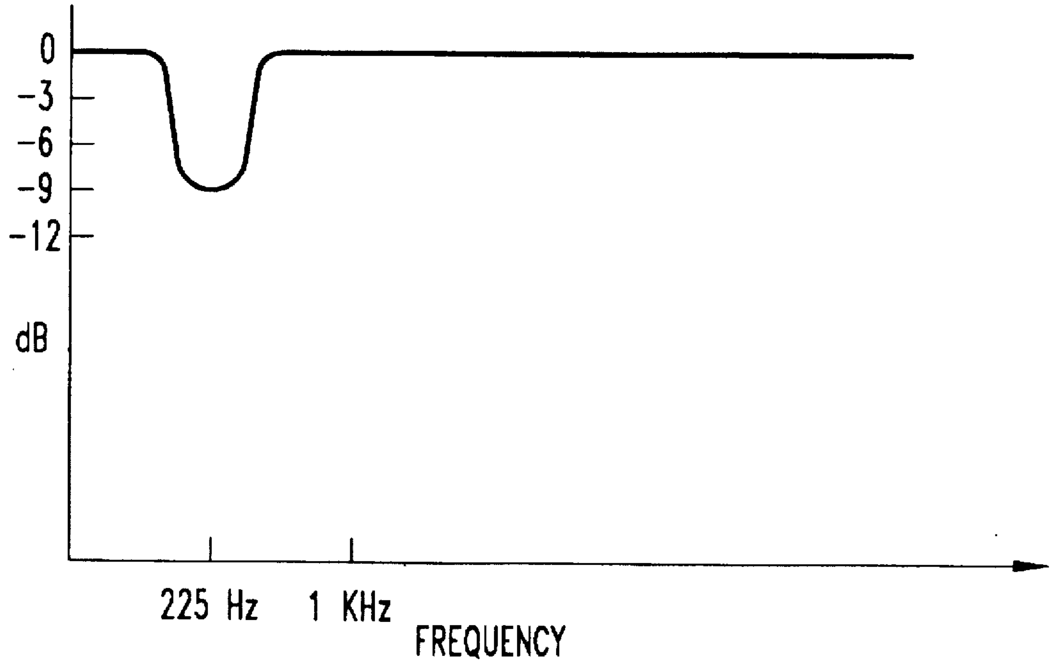
FIG. 3 is a graph of an exemplary frequency response for negatively filtering a sound sample in accordance with the principles of the invention.
Figure 4:
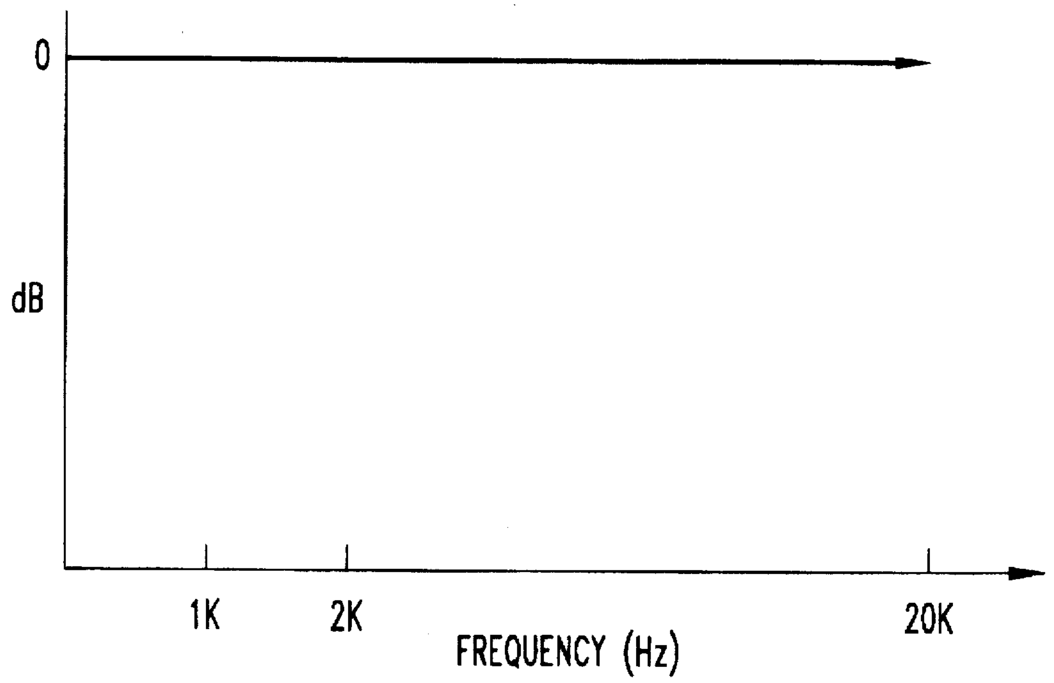
FIG. 4 is a graph of frequency response of a full bandwidth (unattenuated) sound sample.

FIG. 3 illustrates the frequency response of the negative filtering introduced to the voice sample. The frequency response of the voice sample is negatively filtered in a single frequency band, for example between about 50 Hz and about 400 Hz, with −8.5 dB (hence the term "negative filtering") centered at 225 Hz. These frequencies correspond to low frequency tones in the human voice. Note that the negative filtering is approximately equal and opposite in magnitude to the 8.5 dB of gain at 225 Hz introduced by the modifications to the communications facilities. FIG. 4 shows that the full bandwidth signal is used without any attenuation to represent the sound quality attained over the communications facilities subsequent to modifying the facilities.

Digital effects equalizer 102 can be configured using conventional techniques to achieve any desired negative filtering function. One skilled in the art will readily appreciate that the appropriate frequency settings on equalizer 102 can be determined experimentally by applying a test tone from a signal generator (not shown) to equalizer 102 and adjusting the equalizer 102 until the desired filtering function is obtained on a frequency analyzer (not shown) connected to the output of the equalizer.

Referring again to FIG. 2, differences in the sound quality between the negatively filtered sound sample and the full bandwidth (unattenuated) sample may be demonstrated by combining or otherwise editing the two samples in such a manner as to produce a recording of the negatively filtered sound sample followed by the full bandwidth sound sample (step 206). This process is performed for each audio channel to be broadcast (for example, for both the left and right channels of a stereo broadcast). When producing a television commercial, an additional step of transferring the audio signals to a video medium is required (step 208). Step 208 is performed using conventional techniques well-known to those skilled in the art.

Even though pre-transmission power may be increased by either (1) increasing the audio signal level only, or (2) using the negative filtering techniques of the invention, only the negative filtering techniques will successfully produce a demonstrable post-transmission difference in sound quality between first and second audio samples. A broadcast of a television commercial is one example of an application in which the post-transmission difference in sound quality between two samples can be successfully demonstrated using the negative filtering techniques of the invention.

Figure 5:
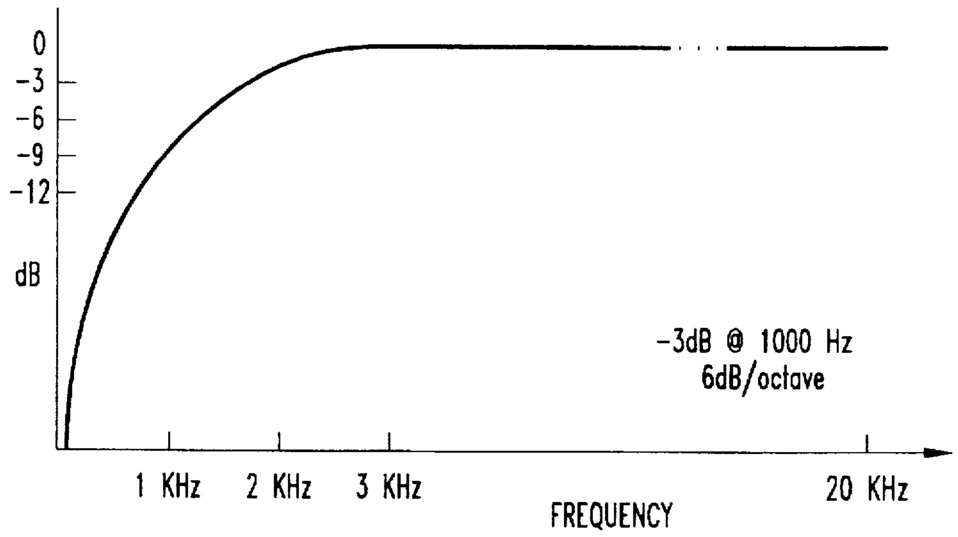
FIGS. 5 and 6 are graphs of alternative frequency responses for negatively filtering samples in accordance with the invention.
Figure 6:
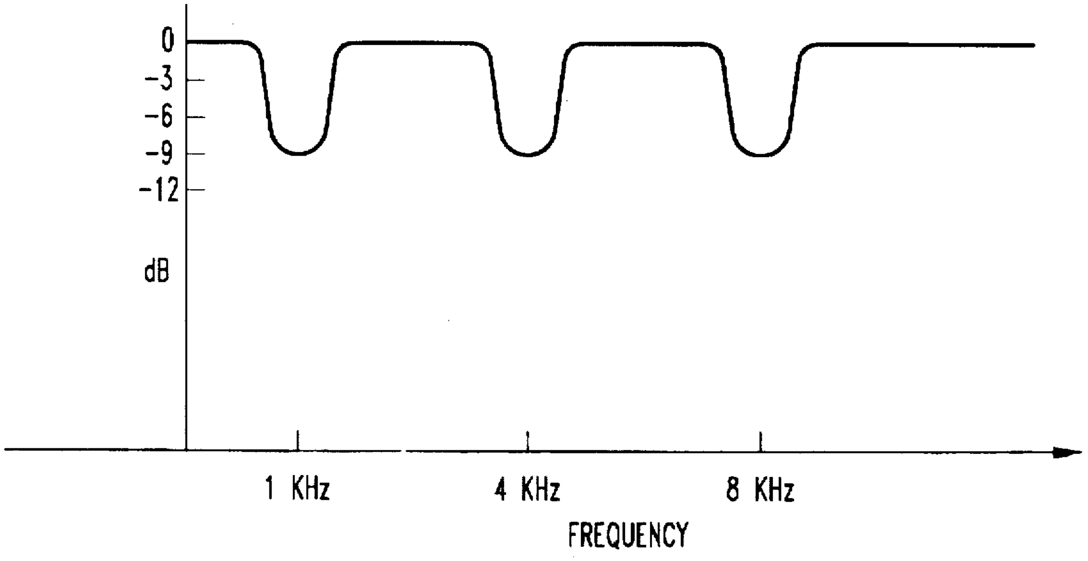

Many different negative filtering functions can be used to achieve different audio effects. FIGS. 5 and 6 show alternative frequency response diagrams for use in negatively filtering audio samples to demonstrate various sound enhancements. FIG. 5 shows a high pass filter (implemented using digital effects equalizer 102) for demonstrating improved low-frequency response. In this case, the high pass filter is set such that the 3 dB point is at 1 kHz, with a slope of −6 dB per octave. FIG. 6 shows a bandpass filter arrangement which negatively filters a voice sample at 1 kHz, 4 kHz, and 8 kHz, to demonstrate improved sound quality in the low, medium, and high frequency ranges, respectively. One skilled in the art will readily appreciate, in view of this disclosure, that audio samples can be negatively filtered at any desired frequency range or set of frequency ranges to demonstrate a desired effect, without departing from the scope of the invention. Again, the attenuation of the signal is inverse to the improvement to be demonstrated. That is, attenuating a sample at 1 kHz will cause a full bandwidth (unattenuated) sample to appear to be enhanced at 1 kHz relative to the negatively filtered sample.

In an alternative embodiment of the invention, the negative filtering techniques of the present invention can be used to demonstrate differences in sound quality in so-called "bandwidth limiting" applications. Bandwidth limiting refers to reducing the bandwidth of the recorded audio samples to less than the full bandwidth signal available on the recording medium of choice. For example, one could demonstrate in a broadcast commercial improvements to a telephone network by limiting the available bandwidth to the 3.5 kHz bandwidth of the telephone network, even though the broadcast bandwidth may be 15 kHz. As in the example described with respect to FIG. 3, sound quality differences are demonstrated in the bandwidth limiting application by using an unattenuated voice sample with a bandwidth of 3.5 kHz as the "full bandwidth" sample, and negatively filtering a different voice sample with a bandwidth of 3.5 kHz as the second sample. These samples are then broadcast in a conventional manner over television or radio broadcast facilities.

Various other modifications can be made without departing from the scope of the invention. For example, although the negative filtering technique of the invention has been described in the context of an alternative to boosting the volume of one of two audio samples to be compared, the negative filtering technique may be used in combination with a volume boost to one of the audio samples. Also, the techniques of the invention could be used to demonstrate differences in sound quality attainable over two different types of communications facilities, such as cable television telephone facilities and conventional switched telephone facilities. Moreover, negative filtering need not be limited to a single audio sample. Both sound samples could be negatively filtered—in different frequency ranges—to show other differences between two audio samples.

What we claim is:

1. A method for demonstrating audio sound quality differences between first and second recorded sound samples broadcast over a broadcast facility, the method comprising the steps of:

negatively filtering the first recorded sound sample;

broadcasting the negatively filtered first sound sample which represents a first level of sound quality over the broadcast facility; and broadcasting the second sound sample which represents a second level of sound quality over the broadcast facility one of before and after broadcasting the negatively filtered first sound sample, whereby the second recorded sound sample is perceived by a listener of the broadcast to have better sound quality than the negatively filtered first sound sample.

2. The method of claim 1 wherein the steps of playing the negatively filtered first sound sample and playing the second sound sample comprise broadcasting the samples sequentially over a radio broadcast facility.

3. The method of claim 1 wherein the steps of playing the negatively filtered first sound sample and playing the second sound sample comprise broadcasting the samples sequentially over a television broadcast facility.

4. The method of claim 1 further comprising the step of negatively filtering a predetermined range of frequencies in the second sound sample, the predetermined range of frequencies in the second sound sample being different from the negatively filtered frequencies in the first sound sample.

5. The method of claim 1 wherein the negative filtering is inversely proportional to a difference in sound quality between the first and second recorded sound samples.

6. The method of claim 1 wherein the negative filtering step comprises filtering range of frequencies in the first sound sample.

7. The method of claim 6 further comprising the step of negatively filtering a second selected range of frequencies in the first sound sample.

8. The method of claim 6 wherein the selected range of frequencies comprises frequencies in the range of about 50 Hz to 1.5 kHz.

9. The method of claim 6 wherein the range of frequencies comprises frequencies in the selected range of about 50 Hz to 400 Hz.

10. A method for processing audio samples for broadcast over a broadcast facility, the method comprising the steps of:

negatively filtering a selected range of frequencies of a first audio sample representing a first level of sound quality to produce a filtered audio sample representing a second level of sound quality different from said first level of sound quality;

recording the filtered audio sample and the first audio sample on a recording medium to produce a combined sequential recording of the first audio sample and the filtered audio sample; and broadcasting the combined sequential recording over the broadcast facility.

11. The method of claim 10 further comprising the step of recording the first audio sample.

12. The method of claim 10 further comprising the step of negatively filtering a second selected range of frequencies in the filtered audio sample.

13. The method of claim 10 further comprising the steps of:

negatively filtering a second selected range of frequencies in the first audio sample, the second selected range of frequencies being different from the frequencies selected to produce the first filtered sample.

14. The method of claim 10 wherein the selected range of frequencies comprises frequencies in a range of about 50 Hz to 1.5 kHz.

15. The method of claim 10 wherein the selected range of frequencies comprises frequencies in a range of about 50 Hz to 400 Hz.

16. The method of claim 10 wherein the negative filtering is inversely proportional to a difference between the first level of sound quality and the second level of sound quality.

17. A method of producing a broadcast audio signal to demonstrate a difference in sound quality between a low sound quality audio sample and a high sound quality audio sample, comprising the steps of:

recording a first pre-broadcast, full bandwidth audio signal;

negatively filtering the first pre-broadcast, full bandwidth audio signal at selected frequencies to form a negatively filtered audio signal;

sequentially recording a second pre-broadcast, full bandwidth audio signal and the negatively filtered audio signal to produce the broadcast audio signal; and broadcasting the broadcast audio signal whereby the second pre-broadcast, full bandwidth audio signal is perceived by a listener of the broadcast audio signal to have better sound quality than the negatively filtered audio signal.

18. A method according to claim 17, wherein the first and second pre-broadcast, full bandwidth audio signals are one of a same audio signal and a different audio signal.

* * * * *